United States Patent [19]

Suzuki et al.

[11] Patent Number: 4,937,792
[45] Date of Patent: Jun. 26, 1990

[54] STATIC RANDOM ACCESS MEMORY DEVICE WITH POWER DOWN FUNCTION

[75] Inventors: Azuma Suzuki, Kawasaki; Masataka Matsui, Tokyo, both of Japan

[73] Assignee: Kabushiki Kaisha Toshiba, Kawasaki, Japan

[21] Appl. No.: 327,272

[22] Filed: Mar. 22, 1989

[30] Foreign Application Priority Data

Mar. 23, 1988 [JP] Japan .................................. 63-68391

[51] Int. Cl.⁵ ............................................. G11C 11/34
[52] U.S. Cl. ................................ 365/233.5; 365/195
[58] Field of Search ................ 365/227, 194, 195, 233

[56] References Cited

U.S. PATENT DOCUMENTS

| 4,669,064 | 5/1987 | Ishimoto ........................... | 365/195 X |
| 4,689,771 | 8/1987 | Wang et al. ...................... | 365/233.5 |
| 4,707,809 | 11/1987 | Ando ................................ | 365/233.5 |

OTHER PUBLICATIONS

Gubbels et al., "A 40-ns/100-pF Low-Power Full-CMOS 256K (32K X 8) SRAM", IEEE Journal of Solid-State Circuits, vol. SC-22, No. 5, Oct. 1987, pp. 741-747.

*Primary Examiner*—Joseph A. Popek
*Attorney, Agent, or Firm*—Finnegan, Henderson, Farabow, Garrett and Dunner

[57] ABSTRACT

A static random access memory device is comprised of a write mode detector for detecting a signal state transition of a write enable signal changing to an active state, an input data transition detector for detecting a transition of the input data supplied from exterior, during a contamination of the active state of the write enable signal, a power down timer for generating a pulse signal with a predetermined pulse width in response to either of the detecting signals outputted from the write mode detector and input data transition detector, a gate circuit for permitting the output data from a row decoder to be transferred to memory cells during a period that the power down timer generates a pulse signal, and for inhibiting that data transfer during a period that the power down timer rests, and a write circuit control circuit allowing a write circuit to supply write data to the bit line pair during a period that the power down timer generates a pulse signal, and prohibiting that write data transfer during a period that the power timer rests.

10 Claims, 5 Drawing Sheets

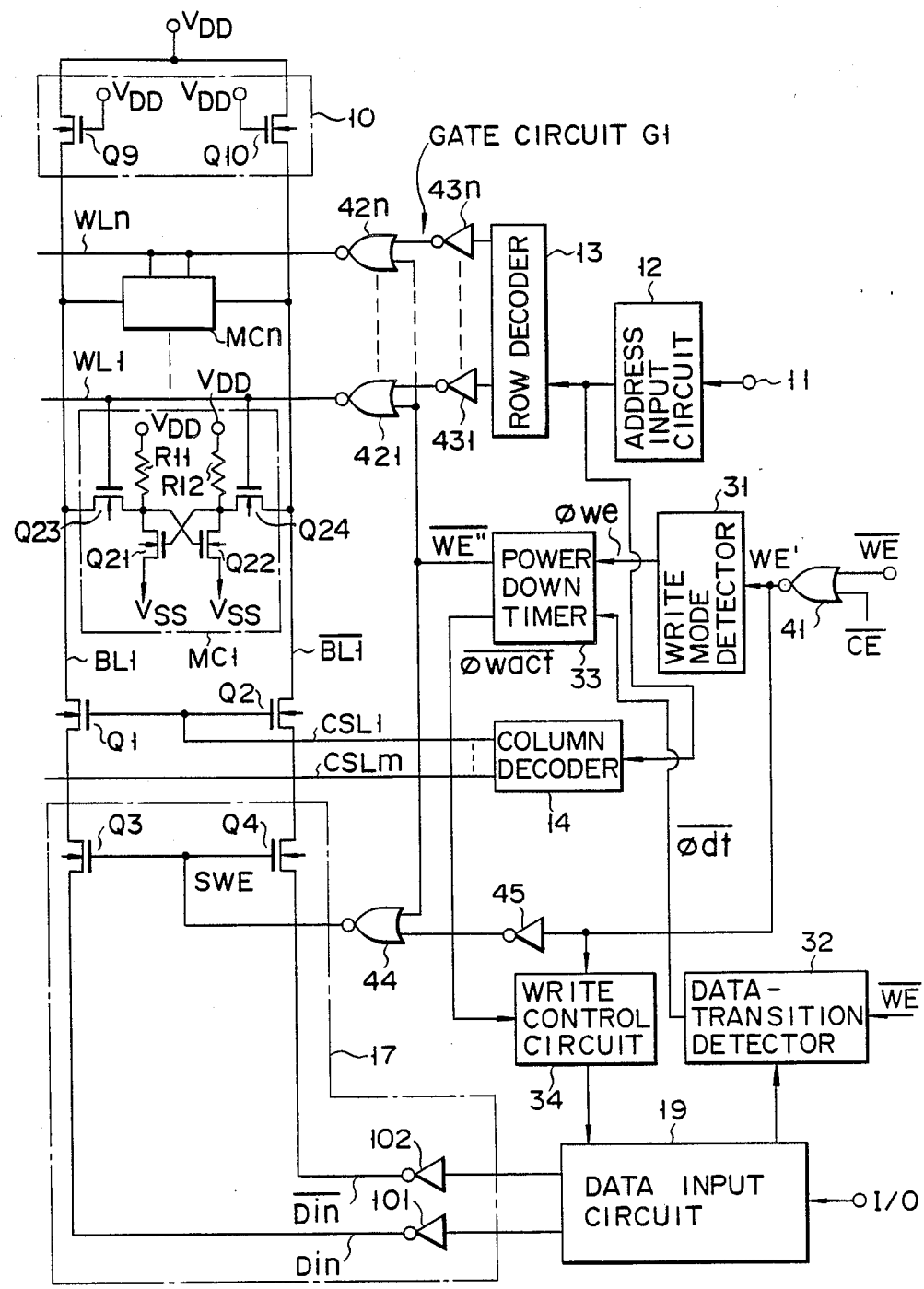
F I G. 2

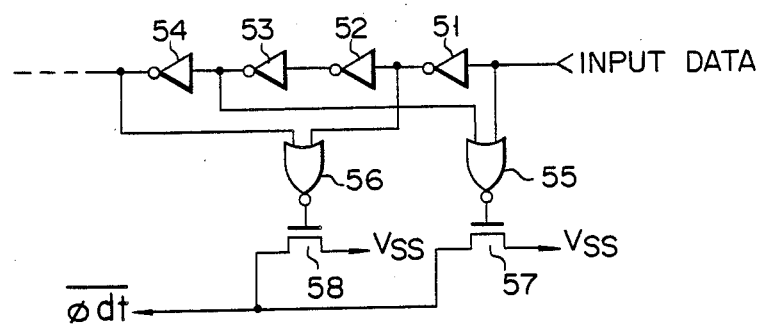
F I G. 3
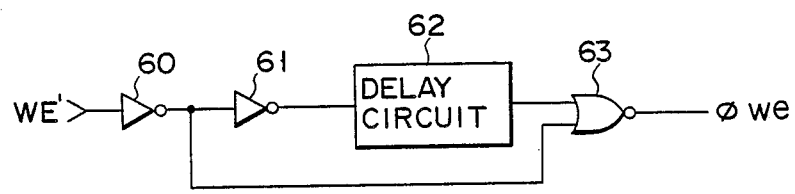
F I G. 4
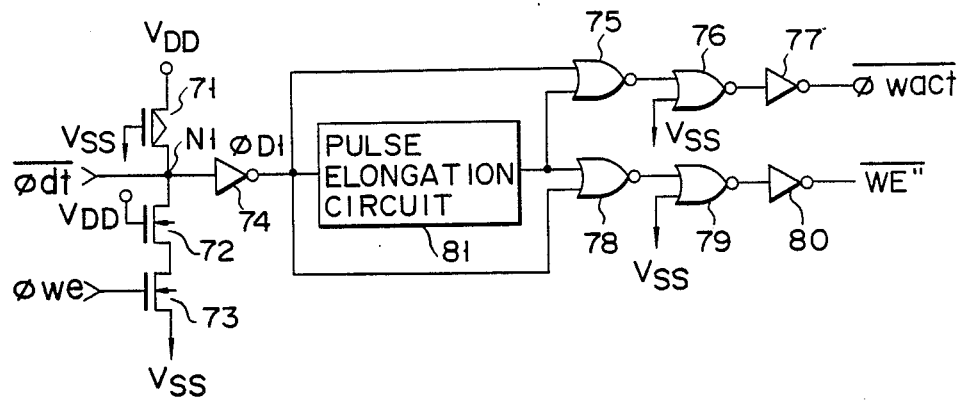
F I G. 5

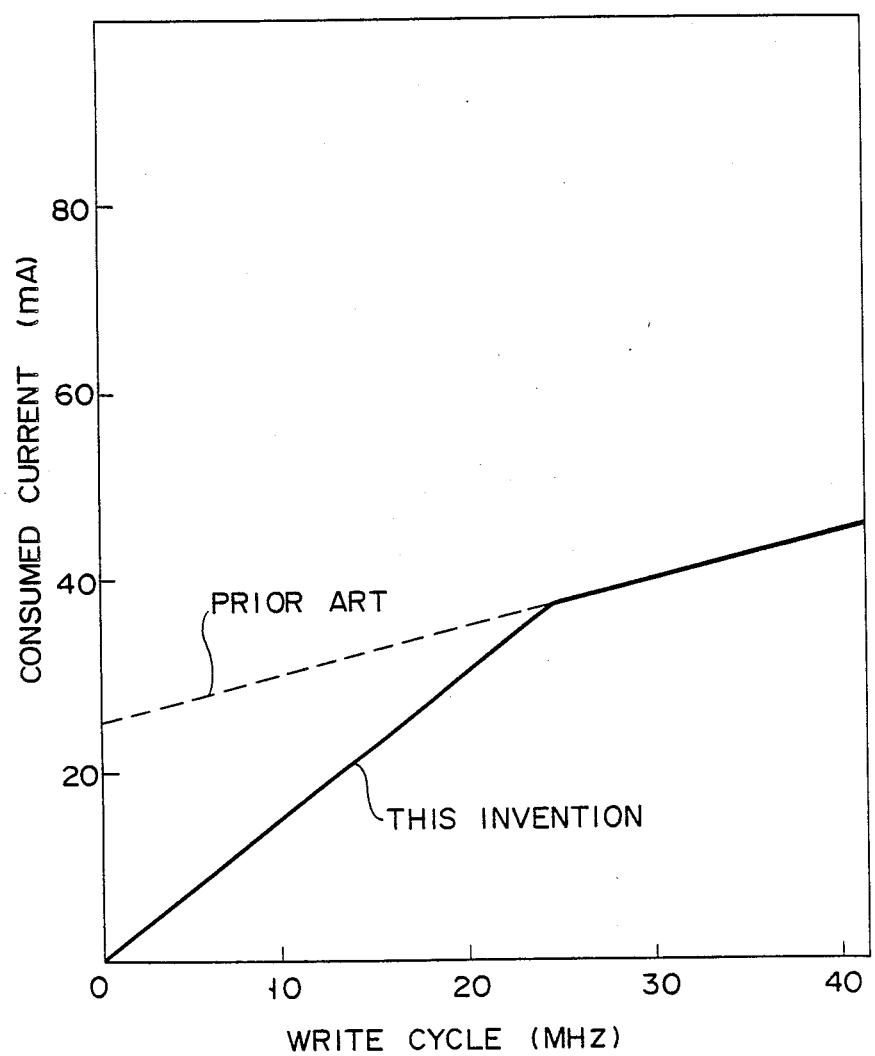
F I G. 8

STATIC RANDOM ACCESS MEMORY DEVICE WITH POWER DOWN FUNCTION

BACKGROUND OF THE INVENTION

1. Field of the Invention

The present invention relates to a static random access memory device, and more particularly to a static random access memory device with a power down function to reduce the consume current during a write cycle.

2. Description of the Related Art

Generally, in a static random access memory device (SRAM), a DC current flow between the terminals of a power source of the device continues during a write cycle. It is for this reason that the consume power of the SRAM is great. How the DC current flows inside the SRAM will be described with reference to FIG. 1.

A circuit configuration of only one column unit of an ordinary SRAM, viz., a configuration concerning a pair of bit lines BL1 and $\overline{BL1}$, is illustrated in FIG. 1. As shown, a memory cell MC1 is made up of a flip-flop including a couple of resistors R1 and R2 and a couple of N channel MOSFETs Q11 and Q12, and a couple of N channel MOSFETs Q13 and Q14 for data transfer. When data "0" is loaded into this memory cell MC1, viz., the potential at node A is placed at "L" level and the potential at node B is placed at "H" level, data $\overline{Din}$ in "L" level is produced from a buffer 101, and data $\overline{Din}$ in "H" level, from a buffer 102. Under this condition, a word line WL1 and a column select line CSL1 are energized by a row decoder and a column decoder (both decoders are not shown), respectively. In turn, N channel MOSFETs Q1, Q2, Q13 and Q14 are turned on. Consequently, the node A is placed in "L" level by the data Din, while the node B, in "H" level by the data $\overline{Din}$. In this way, data "0" is written into the memory cell MC1.

In the SRAM thus configured, the potential of "L" level at the node A turns off FET Q12, and the potential of "H" level at the node B turn on FET Q11. Accordingly, a current I1 indicated by a broken line flows from a power source terminal VDD to a ground VSS terminal, through N channel MOSFETs Q9, Q13 and Q11. Another current I2 also flows from a power source terminal VDD to a ground VSS terminal, through N channel MOSFETs Q9 and Q1, and the MOSFET Q8 in the buffer 101. During a write cycle, the word line WL1 and the column select line CSL1 are kept in an active state, so that during this period, the flow of the currents I1 and I2 continues. This leads to great consume current during the write cycle of the conventional SRAM.

SUMMARY OF THE INVENTION

Accordingly, an object of the present invention is to provide a static random access memory device capable of reducing the consume current during a write cycle.

According to the present invention, there is provided a static random access memory device comprising: a memory cell array having a plurality of static memory cells; a pair of bit lines for transferring data to and from the memory cells in the memory cell array; a write circuit for supplying write data to the bit line pair; memory cell drive section for selectively driving one of the memory cells in accordance with a row address signal supplied from exterior; write mode detecting section for detecting a signal state transition of a write enable signal changing to an active state; input data transision detecting section for detecting a transition of the input data supplied from exterior, during a continuation of the active state of the write enable signal; pulse signal generating section for generating a pulse signal with a predetermined pulse width in response to either of the detecting signals outputted from the write mode detecting section and the input data transition detecting section; drive control section for permitting the memory cell drive section to operate during a period that the pulse signal generating section generates a pulse signal, and for inhibiting the memory cell drive section from operating during a period that the pulse signal generating section rests; and write circuit control section for supplying write data based on the input data to the write circuit during the period that the pulse signal generating section generates a pulse signal, and for supplying to the write circuit initial data to set the bit line pair at the same potentials during the period that the pulse signal generating section rests.

In the static random access memory device thus arranged, the period to execute an actual write operation is the period that the pulse signal generating section generates a pulse signal, not the period of a write cycle as is determined by an external control signal. The reduction of the consume current in a write mode of the SRAM is noticeable particularly when the write cycle is long.

BRIEF DESCRIPTION OF THE DRAWINGS

FIG. 2 is a block diagram showing a static random access memory device according to an embodiment of the present invention;

FIG. 3 is a circuit diagram showing the details of a data transition detector used in the memory device of FIG. 2;

FIG. 4 is a circuit diagram showing the details of a write mode detector used in the memory device of FIG. 2;

FIG. 5 is a circuit diagram showing the details of a write power down timer used in the memory device of FIG. 2;

FIG. 8 is a graph showing a consume current vs. write cycle characteristic of the memory device of FIG. 2.

DETAILED DESCRIPTION OF THE PREFERRED EMBODIMENT

Figure 1:
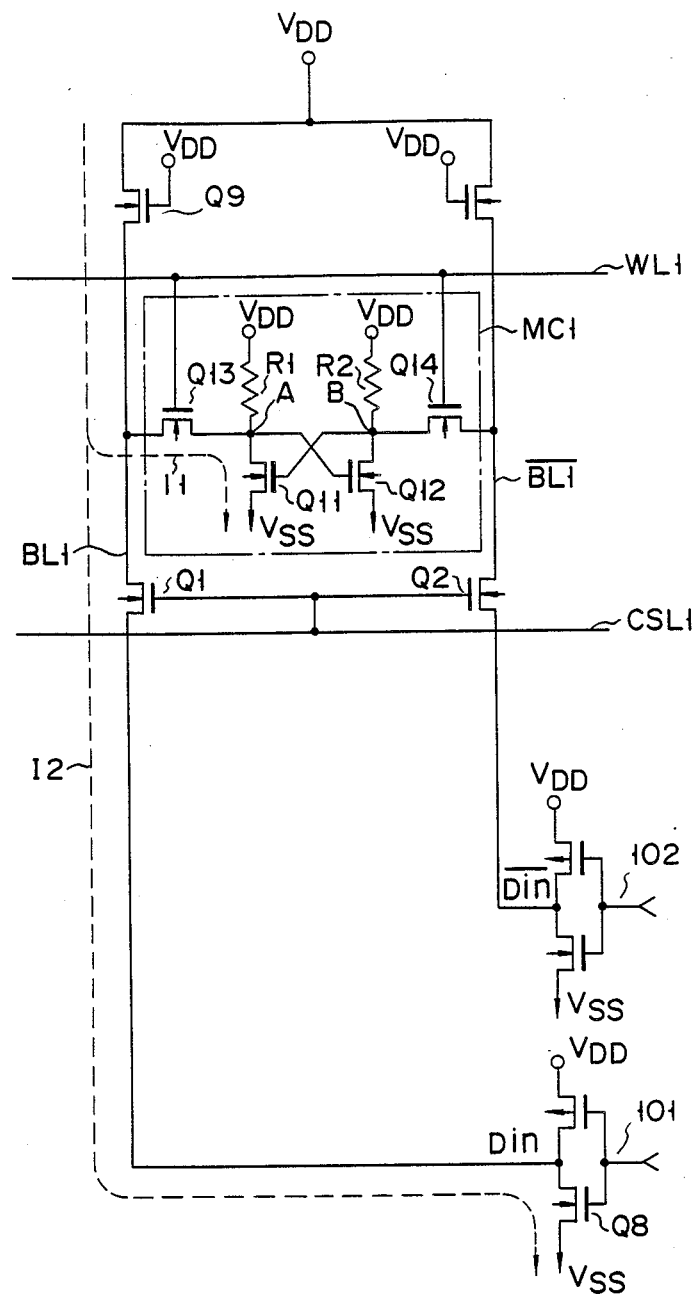
FIG. 1 is a circuit diagram showing a part of a conventional static random access memory device.

Referring to FIG. 2, there is shown a circuit configuration of a static random access memory device (SRAM) according to an embodiment of the present invention. In FIG. 2, only one column unit associated with a pair of bit lines BL1 and $\overline{BL1}$ is illustrated for simplicity. The SRAM is actually composed of a number of column units.

In FIG. 2, static memory cells MC1 to MCn are connected to the cross-points of paired bit lines BL1 and $\overline{BL1}$ and word lines WL1 to WLn. As shown, the memory cell MC1 is made up of a flip-flop including a couple of resistors R11 and R12, a couple of N channel MOSFETs Q21 and Q22, and a couple of N channel MOSFETs Q23 and Q24 for data transfer. The circuit configuration of each of the remaining memory cells is the same as that of the memory cell MC1. The paired bit lines BL1 and $\overline{BL1}$ are coupled at one side with a load circuit 10. The load circuit 10 is also coupled at the other side with a power source VDD. The circuit 10 includes normally-on transistors Q9 and Q10 as N channel MOSFETs.

The paired bit lines BL1 and $\overline{BL1}$ are coupled with a write circuit 17 through N channel MOSFETs Q1 and Q2. N channel MOSFETs Q1 and Q2 are used as switches which respond to an output signal of a column decoder 14 to place paired bit lines BL1 and $\overline{BL1}$ in a select mode or a nonselect mode. The gates of those FETs Q1 and Q2 are connected together to the column select line CSL1. The write circuit 17 for supplying write data to the paired bit lines BL1 and $\overline{BL1}$ is made up of a pair of buffers 101 and 102, and a pair of N channel MOSFETs Q3 and Q4 inserted respectively between the buffers 101 and 102 and the bit line pairs BL1 and $\overline{BL1}$.

An address circuit 12 receives an address signal through an address input terminal 11 from outside, and applies a row address signal contained in the address signal to a row decoder 13, and a column address signal to a column decoder 14. The row decoder 13 decodes a row address signal, and produces a signal to select one of the word lines WL1 to WLn. The output signal of the row decoder 13 is transferred to the word lines WL1 to WLn by way of a gate G1. The gate G1 includes NOR gates 421 to 42n and inverters 431 to 43n. The column decoder 14 decodes a column address signal, and produces a signal to select one of column select lines CSL to CSLm.

A write mode detector 31 is for detecting a level transition of a write enable $\overline{WE}$ signal going active, i.e., low "L" in level. The write enable signal $\overline{WE}$ and a chip enable signal $\overline{CE}$ are applied to NOR gate 41, from exterior. The NOR gate 41, after receiving these signals, produces a signal WE', which in turn is applied to the write mode detector 31. During an active state of the chip enable signal $\overline{CE}$, if the write enable signal $\overline{WE}$ changes its signal state from a nonactive state to an active state, the write mode detector 31 produces a one-shot pulse $\phi$we as a write mode detect signal. During an active state of the chip enable signal $\overline{WE}$, if input data IN which is supplied to a data input circuit 19 from exterior, changes from "0" to "1" or "1" to "0", the data transition detector 32 produces a one-shot pulse $\overline{\phi dt}$ as a data transition detect signal. The write mode detect signal $\overline{\phi we}$ and the data transition detect signal $\overline{\phi dt}$ are supplied to a write power down timer 33.

The write power down timer 33, when receiving either the detect signal $\phi$we or $\overline{\phi dt}$, produces simutaneously two signals $\overline{WE''}$ and $\overline{\phi act}$ that are in "0" level during a predetermined period. Those pulses $\overline{We''}$ and $\overline{\phi wact}$ have the same pulse widths or the latter is slightly longer than the faster.

The pulse signal WE" is for controlling the gating operation of the gate circuit G1 and the write circuit 17. The pulse signal $\overline{WE''}$ is applied to the first input terminals of NOR gates 421 to 42n, which are respectively coupled with the word lines WL1 to WLn. The second input terminals of these NOR gates 421 to 42n are coupled for reception with the output signal of the row decoder 13, through inverters 431 to 43n. Accordingly, when the row decoder 13 produces a drive signal to drive the word line WL1, during a period that the pulse signal $\overline{WE''}$ is generated, viz., during an "L" level period, the gate G1 allows the drive signal to go to the word line WL1. During a period that no pulse signal $\overline{WE''}$ is generated, viz., during an "H" level period, the gate G1 prohibits the drive signal from going to the word line WL1.

The pulse signal $\overline{WE''}$ is also applied to the first input of a NOR gate 44, which is connected to the gates of the N channel MOSFETs Q3 and Q4 in the write circuit 17. The output signal WE' of the NOR gate 41 is applied through an inverter 45 to the second input of the NOR gate 44. Accordingly, the write buffers 101 and 102 are allowed to be coupled with the paired bit lines BL1 and $\overline{BL1}$ only when the SRAM is in a write mode and during a perior that the pulse signal $\overline{WE''}$ is being generated. During a period that the pulse signal $\overline{WE''}$ generation rests, the write buffers 101 and 102 are separated from the paired bit lines BL1 and $\overline{BL1}$.

The pulse signal $\overline{\phi wact}$, together with the output signal WE' of the NOR gate 41, is supplied to the write control circuit 34. The write control circuit 34 controls a data input circuit 19 is accordance with these signals $\overline{\phi wact}$ and WE'. During a period that the pulse signal $\overline{\phi wact}$ is generated, viz., when it is in "L" level, the write control circuit 34 controls the data input circuit 19 so that the circuit 19 transfers the write data corresponding to the externally applied input data IN to the write circuit 17. When the input data IN is "0" in logical level, the output signals of the write buffers 101 and 102 in the write circuit 17 are set to "L" and "H" levels by the write control circuit 34 and the data input/output circuit 19, respectively. When the input data IN is "1", the write buffers 101 and 102 are set to "H" and "L" levels. During a period of nongeneration of the pulse signal $\overline{\phi wact}$, that is, when the pulse signal is in "H" level, the write control circuit 34 controls the data input circuit 19 so that the circuit 19 transfers write initial setting data to the write circuit 17. The initial setting data places both the output signals of the buffer 101 and 102 in "H" level.

It is noted that in the SRAM of the present embodiment, an actual write operation period is determined by the pulse signals $\overline{WE''}$ and $\overline{\phi wact}$. Therefore, the periods that the DC currents I1 and I2 flow (see FIG. 1) are reduced. In other words, the power dissipation during the write cycle can be reduced.

The data transition detector 32 may be formed by using inverters 51 to 54, NOR gates and 56, and N channel MOSFETs 57 and 58, as shown in FIG. 3. When the input data changes its logical state from "1" to "0", a pulse signal that is set in "1" level during a period equal to a total sum of delay times by three inverters 51 to 53, is produced from the NOR gate 55, and applied to the gate of the FET 57. When it is changed from "0" to "1", the NOR gate 6 produces a pulse signal that is set in "1" level during a period equal to a total sum of delay times by three inverters 52 to 54, and applies it to the gate of the FET 58. At both the transient of the input data from "0" to "1" and "1" to "0", the detect signal $\overline{\phi dt}$ is maintainted "L" level during a predetermined period from the transition time.

The details of the write mode detector 31 is shown in FIG. 4. The detector 31 is made up of inverters 60 and 61, a delay circuit 62, and a NOR gate 63. The first input of the NOR gate 63 is coupled for reception with the output signal WE' of the NOR gate 41 (FIG. 2) through the inverter 60, while the second input of the same receives the output signal WE' through the inverters 60 and 61, and the delay circuit 62. Accordingly, when the signal WE' changes from "L" to "H", the NOR gate 63 produces a detect signal φwe in the form of a pulse signal that is placed in "H" level during a period corresponding to the delay time by the delay circuit 62.

The details of the write power down timer 33 is shown in FIG. 5. A series circuit including a P channel MOSFET 71 and an N channel MOSFETs 72 and 73 is inserted between a power source VDD terminal and a ground VSS terminal. The FETs 71 and 72 are normally in an on state, and a node N1 of these transistors 71 and 72 is coupled with a detect signal $\overline{\phi dt}$ supplied from the data transition detector 32. The gate of the FET 73 receives a detect signal φwe from the the write mode detect circuit 31. The potential at the node N1 continues an "L" level during a predetermined period when it receives the signal $\overline{\phi dt}$ or φwe. The inverter 74 produces a pulse signal φD1 of a predetermined "H" level duration. This pulse signal φD1 is directly applied to the first input terminals of the NOR gates 75 and 78, and is applied to the second input terminals of the NOR gates 75 and 78 through a pulse elongation circuit 81. The pulse elongation circuit 81 functioning to elongate the pulse width of the pulse signal φD1 outputted from the inverter 74, may be constructed by the pulse generating circuit shown in FIG. 4. The output signals of the NOR gates 75 and 78 are placed in "L" level during a period corresponding to the pulse width obtained by the pulse elongation circuit 81. The output signal of the NOR gate 75 is supplied to the second input of a NOR gate 76 whose first input is connected to the ground VSS terminal. The output signal of this NOR gate 76 is supplied as a signal $\overline{\phi wact}$, by way of the inverter 77. The output of the NOR gate 78 is coupled with the second input of a NOR gate 79 that is connected at the first input to the ground VSS terminal. The output signal of the NOR gate 79 is output as a signal $\overline{WE''}$, by way of an inverter 80.

The write power down timer 33 thus arranged, when receiving either detect signal $\overline{\phi dt}$ or φwe, produces pulse signals $\overline{\phi wact}$ and $\overline{WE''}$ each having a pulse width as obtained by the pulse elongation circuit 81.

The operation of the SRAM according to the present invention in a write mode will be described with reference to FIGS. 6 and 7. The timing charts shown in these figures are for the SRAM using the write mode detector 31, data transition detector 32, write power down timer 33, which are illustrated in FIGS. 3 through 5, respectively.

Figure 6:
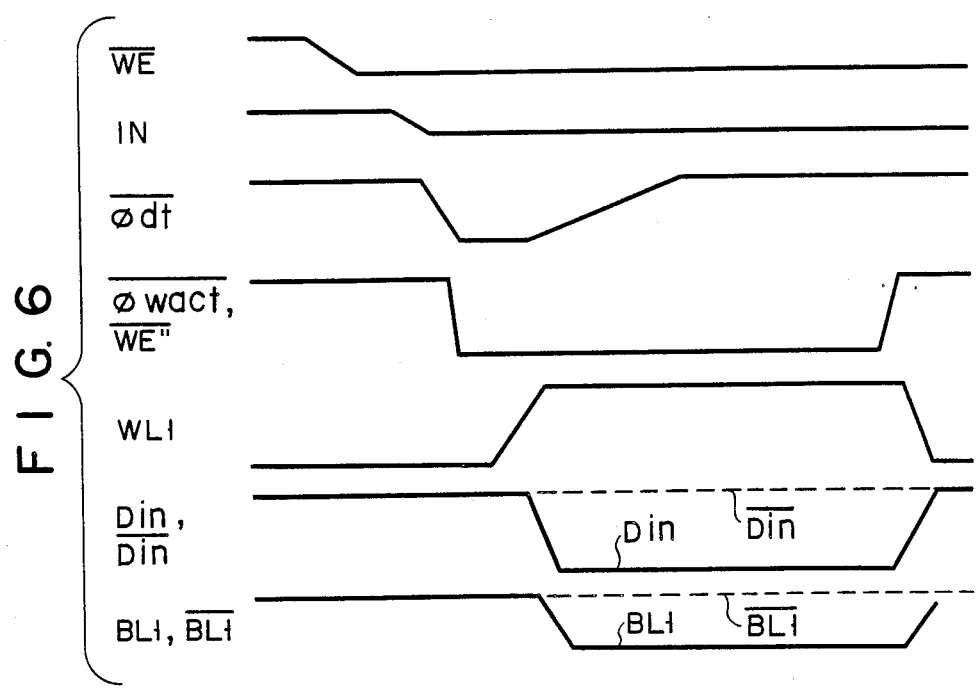
FIGS. 6 and 7 are timing charts useful in explaining the operation of the memory device of FIG. 2.

A timing chart of FIG. 6 is obtained under conditions that an externally applied write enable signal $\overline{WE}$ is in an active state, i.e., in "0" level, and a logical state of input data IN changes from a "1" state to "0" state. When the input data IN changes its logical state from "1" to "0", the data transition detector 32 detects the transition and produces a detect signal $\overline{\phi dt}$. When this detect signal $\overline{\phi dt}$ is applied to the power down timer 33, the write power down timer 33 produces a pulse signal $\overline{\phi wact}$, $\overline{WE''}$ each having a predetermined "L" duration. During the period of generating the pulse signal $\overline{WE''}$, the energization of the word line is allowed by the gate circuit G1. Hence, when the word line WL1 is selected, its potential rises as shown, and falls at the trailing edge of the pulse signal $\overline{WE''}$. During a period that the pulse signal $\overline{\phi wact}$, $\overline{WE''}$ is in "L", the write data corresponding to the input data IN is inputted to the write circuit 17, and the FETs Q3 and Q4 in the write circuit 17 are in an on state. During this period, therefore, the data lines Din and $\overline{Din}$ and the bit lines BL1 and $\overline{BL1}$ are set at a potential based on the the input data. Under this condition, the write data is written into the memory cell MC1. The write operation is executed only during the "L" level period of the pulse signal $\overline{\phi wact}$, $\overline{WE''}$. When the pulse signal $\overline{\phi wact}$, $\overline{WE''}$ goes high ("H") in level, the energization of the word line WL1 is inhibited. At the same time, the supply of the write data is prohibited. No data write operation will be performed. Therefore, if the pulse width of the pulse signal φwact, WE'' is selected to be short as possible, under a condition that the data setup up time (Tds) proper to the SRAM is satisfied, the reduction of the DC currents can be realized without erroneous writing of data.

Figure 7:
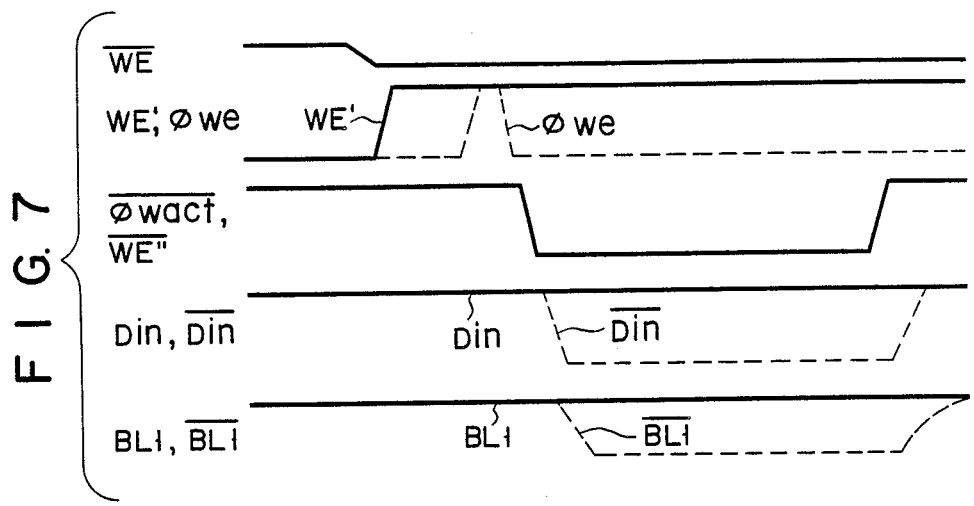

The timing chart shown in FIG. 7 is depicted when the input data is "1" and the write enable signal $\overline{WE}$ changes from "H" to "L", viz., changes to an active state. During a period that the chip enable signal $\overline{CE}$ bar is in "L" level, when the write enable signal $\overline{WE}$ becomes "L" in level, the output signal WE' of the NOR gate 41 rises to "H" level. The write mode detector 31 detects the signal WE' of "H" level and produces a detect signal φwe. When receiving the detect signal φwe, the write power down timer 33 produces a pulse signal $\overline{\phi wact}$, $\overline{WE''}$ each having a predetermined "L" duration. As described earlier, during the period of generating the pulse signal $\overline{\phi wact}$, $\overline{WE''}$, the word line WL1 is driven and the write data based on the input data is supplied to the write circuit 17. When the input data IN is "1", the data lines Din and $\overline{Din}$ are respectively set at "H" and "L" levels, so that the bit lines BL1 and BL1 bar also set at "H" and "L", respectively. As a result, data "1" is written into the memory cell MC1. When the pulse signal $\overline{\phi wact}$, $\overline{WE''}$ goes high ("H") in level, the energization of the work line WL1 is inhibited. At the same time, the supply of the write data is prohibited. No data write operation will be performed. Therefore, if the pulse width of the pulse signal $\overline{\phi wact}$, $\overline{WE''}$ is selected to be short as possible, under a condition that the data set-up time (Tds) proper to the SRAM is satisfied, the reduction of the DC currents can be realized without erroneous writing of data.

As seen from the foregoing description, in the SRAM according to the present invention, the period of executing an actual write operation can be uniquely determined within the SRAM circuit, not using an external control signal. As seen from FIG. 8, accordingly, the consume current of the SRAM according to the present invention is comparable with that of the conventional one with no power down function, when the writing operation is at a high speed more than 25 MHz. In a low speed write operation less than 25 MHz, the consume current is considerably reduced when comparing with that of the conventional SRAM.

In the above-mentioned SRAM circuit, the control by the power down timer 33 is applied to the word line, and further the switch circuit (FETs Q3 and Q4) and the write buffers 101, 102 that are provided in the write circuit 17. The DC current saving may be realized by applying that control to the word line and the write buffers except the switch circuit (FETs Q3 and Q4). The reason for this is that when the output signals of the buffers 101 and 102 are in "H", no DC current flows even when the switch circuit (FETs Q3, Q4) is in an on state.

In this case, to prevent an erroneous data writing into the memory cell, it is desirable to time the circuit operation so that the setting of the output data of the buffer 101 and 102 in "H" level follows the word line drive is prohibited. To this end, the write power down timer 33 must produce a pulse signal $\overline{WE''}$ of a predetermined pulse width and a pulse signal φwact of a pulse width longer than that of the former. This is realized with substituting of two pulse width elongation circuits producing signals of different pulse widths for the pulse width elongation circuit 81. Of the pulse width signals, a shorter pulse width signal is coupled with the NOR gate 78 (FIG. 5) and a longer pulse width signal, with the NOR gate 75.

What is claimed is:

1. A static random access memory device comprising:
   a memory cell array having a plurality of static memory cells;
   a pair of bit lines for transferring data to and from said memory cells in said memory cell array;
   a write circuit for supplying write data to said bit line pair;
   memory cell drive means for selectively driving one of said memory cells in accordance with a row address signal supplied from exterior;
   write mode detecting means for detecting a signal state transition of a write enable signal changing to an active state;
   input data transition detecting means for detecting a transition of the input data supplied from exterior, during a continuation of the active state of said write enable signal;
   pulse signal generating means for generating a pulse signal with a predetermined pulse width in response to either of the detecting signals from said write mode detecting means and said input data transition detecting means;
   drive control means for permitting said memory cell drive means to operate during a period that said pulse signal generating means generates a pulse signal, and for inhibiting said memory cell drive means from operating during a period that said pulse signal generating means rests; and
   write circuit control means for supplying write data based on said input data to said write circuit during said period that said pulse signal generating means generates a pulse signal, and for supplying to said write circuit initial data to set said bit line pair at the same potentials during said period that said pulse signal generating means rests.

2. A static random access memory device according to claim 1, in which said pulse signal generating means simultaneously generates a first pulse signal and a second pulse signal of a wider pulse width than that of said first pulse signal, said first pulse signal being supplied to said drive control means, and said second pulse signal being supplied to said write circuit control means.

3. A static random access memory device according to claim 1, in which said write circuit includes write buffers for supplying write data to said bit line pair and a switch circuit inserted between said paired bit lines and write buffers, and said switch circuit is turned on only under conditions that said write enable signal is in an active state and said pulse generating means is generating a pulse signal.

4. A static random access memory device according to claim 1, in which said memory cell drive means (13) includes a row decoder.

5. A static random access memory device according to claim 4, in which said drive control means includes a gate circuit gated by the pulse signal outputted from said pulse signal generating means, said gate circuit being provided on the output side of said row decoder.

6. A static random access memory device according to claim 1, further comprising a load circuit connected at one end to said paired bit lines and at the other end to a power source potential supply terminal in a first logic level, and wherein said write circuit control means supplies write data based on said input data to said write circuit so that during said period that said pulse signal generating means generates a pulse signal, one of said paired bit lines is set in the first logic level, while the other in a second logic level, and said write circuit control means supplies to said write circuit write data to set both of said paired bit lines in said first logic level during said period that said pulse signal generating means rests.

7. A static random access memory device comprising:
   a memory cell array having a plurality of static memory cells;
   a pair of bit lines for transferring data to and from said memory cells in said memory cell array;
   memory cell drive means for selectively driving one of said memory cells in accordance with a row address signal supplied from exterior;
   write mode detecting means for detecting a signal state transition of a write enable signal changing to an active state;
   input data transition detecting means for detecting a transition of the input data supplied from exterior, during a continuation of the active state of said write enable signal;
   pulse signal generating means for simultaneously generating a first pulse signal and a second pulse signal of a wider pulse width than that of said first pulse signal in response to either of the detecting signals outputted from said write mode detecting means and said input data transition detecting means;
   a write circuit for supplying write data to said paired bit lines, including write buffers for supplying write data to said bit line pair and a switch circuit inserted between said paired bit lines and the write buffers, and said switch circuit is turned on only under conditions that said write enable signal is in an active state and said pulse generating means is generating a pulse signal;
   drive control means for permitting said memory cell drive means to operate during a period that said pulse signal generating means generates said first pulse signal, and for inhibiting said memory cell drive means from operating during a period that said pulse signal generating means rests; and
   write circuit control means for supplying write data based on said input data to said write circuit during said period that said pulse signal generating means generates said second pulse signal, and for supplying to said write circuit initial data to set said bit line pair at the same potentials during said period that said pulse signal generating means rests.

8. A static random access memory device according to claim 7, in which said memory cell drive means includes a row decoder.

9. A static random access memory device according to claim 8, in which said drive control means includes a gate circuit gated by the pulse signal outputted from said pulse signal generating means, said gate circuit being provided on the output side of said row decoder.

10. A static random access memory device according to claim 7, further comprising a load circuit connected at one end to said paired bit lines and at the other end to a power source potential supply terminal in a first logic level, and wherein said write circuit control means supplies write data based on said input data to said write circuit so that during said period that said pulse signal generating means generates a pulse signal, one of said paired bit lines is set in the first logic level, while the other in a second logic level, and said write circuit control means supplies to said write circuit write data to set both of said paired bit lines in said first logic level during said period that said pulse signal generating means rests.

* * * * *